United States Patent
Reynes et al.

(10) Patent No.: US 8,779,465 B2
(45) Date of Patent: Jul. 15, 2014

(54) SEMICONDUCTOR DEVICE AND METHOD OF FORMING A SEMICONDUCTOR DEVICE

(75) Inventors: Jean-Michel Reynes, Pompertuzat (FR); Philippe Lance, Toulouse (FR); Evgueniy Stefanov, Vielle Toulouse (FR); Yann Weber, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 385 days.

(21) Appl. No.: 12/441,311

(22) PCT Filed: Sep. 22, 2006

(86) PCT No.: PCT/IB2006/003914
§ 371 (c)(1),
(2), (4) Date: Mar. 13, 2009

(87) PCT Pub. No.: WO2008/035134
PCT Pub. Date: Mar. 27, 2008

(65) Prior Publication Data
US 2009/0267112 A1    Oct. 29, 2009

(51) Int. Cl.
*H01L 27/06* (2006.01)
*H01L 21/331* (2006.01)

(52) U.S. Cl.
USPC .................. 257/140; 438/138; 257/E27.015; 257/E21.382; 257/E21.158

(58) Field of Classification Search
USPC .................. 257/E29.027, E29.066, E29.127, 257/E29.201, E21.382, 40, E27.015, 257/E21.158; 438/138
See application file for complete search history.

(56) References Cited

U.S. PATENT DOCUMENTS

| | | | |
|---|---|---|---|
| 4,630,084 A | 12/1986 | Tihanyi | |
| 4,831,423 A * | 5/1989 | Shannon | ........................ 257/141 |
| 4,952,992 A | 8/1990 | Blanchard | |
| 5,488,236 A * | 1/1996 | Baliga et al. | .................. 257/132 |
| 6,812,524 B2 | 11/2004 | Ahlers et al. | |
| 2002/0096708 A1 | 7/2002 | Ahlers et al. | |
| 2003/0230767 A1 | 12/2003 | Tihanyi et al. | |

FOREIGN PATENT DOCUMENTS

| | | |
|---|---|---|
| DE | 19815907 C1 | 5/1999 |
| WO | 2006024322 A1 | 3/2006 |
| WO | 2006025034 A | 3/2006 |

OTHER PUBLICATIONS

Chen et al; "A novel high-voltage sustaining structure with buried oppositely doped regions" IEEE Transactions on Electron Devices, vol. 47, Issue 6, Jun. 2000 pp. 1280-1285.
Toyota; "Floating Island and Thick Bottom Oxide Trench Gate MOSFET (FITMOS)" IEEE International Symposium on Power Semiconductor Devices and IC's, Jun. 2006, pp. 1-2.
Toshiba; "A novel Low on-Resistance Schottky-Barrier Diode with p-Buried Floating Layer Structure"; IEEE Trans on ED vol. 51, No. 5, May 2004.

* cited by examiner

*Primary Examiner* — Matthew W Such
*Assistant Examiner* — Monica D Harrison

(57) ABSTRACT

A semiconductor device arrangement comprises a semiconductor device and an injector device. The semiconductor device comprises a first current electrode region of a first conductivity type, a second current electrode region of the first conductivity type, a drift region between the first and the second current electrode regions, and at least one floating region of a second conductivity type formed in the drift region. The injector device is arranged to receive an activation signal when the semiconductor device is turned on and to inject charge carriers of the second conductivity type into the drift region and the at least one floating region in response to receiving the activation signal.

20 Claims, 8 Drawing Sheets

SEMICONDUCTOR DEVICE AND METHOD OF FORMING A SEMICONDUCTOR DEVICE

FIELD OF THE DISCLOSURE

This disclosure relates to semiconductor device arrangements and methods of forming a semiconductor device arrangement.

BACKGROUND

Semiconductor devices such as Metal Oxide Semiconductor Field Effect Transistors (MOSFETs) are commonly used as power devices in applications, such as automotive electronics, power supplies, telecommunications, which applications require devices to operate at currents in the range of tenths up to hundreds of amperes (A).

Conventionally, by applying a voltage to the gate electrode of a MOSFET device, the device is turned on and a channel will be formed connecting the source and the drain regions allowing a current to flow. A lightly doped drift region is formed between the drain region and the channel. The drift region is required to be lightly doped in order to lower the maximum electric field that develops across the drift region and to thus, ensure a high breakdown voltage. Once the MOSFET device is turned on, the relation between the current and the voltage is nearly linear which means that the device behaves like a resistance. The resistance is referred to as the on-state resistance Rdson.

Typically, MOSFET devices with low on-state resistance Rdson are preferred as they have higher current capability. It is well known that the on-state resistance Rdson may be decreased by increasing the packing density of a MOSFET device i.e. the number of base cells per $cm^2$. For example, a hexagonal MOSFET (HEXFET) device comprises a plurality of cells, each cell having a source region and a hexagonal polysilicon gate, and has a high packing density e.g. $10^5$ hexagonal cells per $cm^2$. Due to the large number of cells and the aspect ratio which may be defined as the ratio between the length of the hexagonal perimeter of the source region and the area of the unit cell, the on-state resistance of a HEXFET device can be made very low. Usually, the smaller the size of the cells, the higher is the packing density and thus, the smaller the on-state resistance. Therefore, many improvements to MOSFET devices are aimed at reducing the size of the cells.

However, it is well known that the breakdown voltage of MOSFET devices increases as the on-state resistance Rdson of the devices increases. Thus, there is a trade-off between reducing Rdson and having a high enough break down voltage BVdss.

In an attempt to reduce the on-state resistance Rdson of a MOSFET device whilst not impacting significantly the breakdown voltage of the device, it has been proposed to introduce multilayer structures in the drift region of the device. An article entitled 'A Novel High-Voltage Sustaining Structure with Buried Oppositely Doped Regions' by Xing Bi Chen, Xin Wang and Johnny K. O. Sin, in IEEE Transactions on Electron Devices, Vol. 47. No. 6, June 2000 describes a structure with buried floating regions in the drift region of the MOSFET device connected together at an edge termination. In the case of p-type buried floating regions in a n-type drift region, due to the negative charges in the depleted p-type buried floating regions, a large part of the flux induced by the positive charges of the depleted n-drift region are terminated on the buried floating regions so that the field intensity is not allowed to accumulate throughout the entire thickness of the drift region. This means that a larger doping density can be used in the drift region without producing a high peak field. Since a larger doping density in the drift region can be used, the on-state resistance Rdson is reduced. Thus, by using buried floating regions, the resistivity and/or thickness of the drift region can be made smaller than that of a conventional MOSFET device with the same breakdown voltage and therefore, the on-state resistance Rdson can be reduced.

When the MOSFET device is turned on, the on-state resistance is momentarily high due to the drift region and the buried floating regions being fully depleted, and only a small current flows in the channel. In order to turn the device on fully (ie. unblock the device), the majority carriers in the buried floating regions and the drift region have to be recovered. A MOSFET is an unipolar or a majority carrier device and thus, when the channel is opened, electrons can be easily recovered for the n-type regions (e.g. the drift region) from the source. However, it is more difficult to recover holes for the p-type buried floating regions as a unipolar device cannot provide any holes to these regions.

Thus, there is a delay between turning on a device and the device being fully on which delay depends on the time required to recover the majority charge carriers in the depleted regions. Ideally the aim when designing devices is to arrange for the delay to be zero or as close to zero as possible.

In the arrangement described in the article by Chen et al, as the p-type buried floating regions are connected together at a p-type edge termination which is connected to the source through a p-type body region, when the MOSFET device is turned on after being turned off, a path is established which provides holes to the p-type buried floating regions which are depleted during the reverse drain voltage. This helps in the process of recovering the majority carriers in the buried floating regions which enables the MOSFET device to be turned on fully. In view of the connection to the edge termination, the p-type buried floating layers are not electrically isolated from the source and so are not properly 'floating'.

Since the p-type edge termination must be carefully designed to avoid any leakage issues and extra steps are required to form the edge termination, the arrangement disclosed in this article is costly and complex to manufacture. Furthermore, such an arrangement is not compatible with typical planar processes used in semiconductor device manufacturing processes.

An article entitled 'A Novel Low On-Resistance Schottky-Barrier Diode with p-Buried Floating Layer Structure' by Wataru Saito, Ichiro Omura, Ken'ichi Tokano, Tsuneo Ogura and Hiromichi Ohashi in IEEE Transactions on Electron Devices, Vol. 51, No. 5, May 2004 discloses a Schottky-Barrier Diode (SBD) having p-type buried floating layers in the drift region which enhance the development of depletion in the drift region. In the arrangement disclosed in this article, the buried floating layers are isolated from the p regions at the surface of the SBD so that when the MOSFET device is turned off and a reverse voltage is applied between the drain and source regions, the p-type buried floating layers and the drift region are fully depleted and there are no longer any free charge carriers in the drift region before breakdown is reached, which results in a high breakdown voltage. The result is the doping concentration of the drift region can be increased and so the on-state resistance of the SBD can be reduced.

When the device is turned on, the on-state resistance is momentarily high due to the drift region and the buried floating layers being fully depleted, and only a small current flows in the channel. In order to turn the device on fully (ie. unblock the device), the majority carriers in the buried floating layers and the drift region have to be recovered. This article identifies the problem of recovering holes for the p-type buried floating layers and suggests a mechanism by which the majority p charge carriers or holes can be recovered in the p-type buried floating layers by the parasitic action of a bipolar device set up by the p-type guard rings and p-type grids at the surface of the SBD. However, the analytical solution disclosed in this article relies on a parasitic bipolar action whose impact on device behaviour is difficult to control. Thus, such a parasitic solution is hard to apply to semiconductor devices manufactured for applications which require greater control over the device behaviour.

There is therefore a need for an improved semiconductor device arrangement.

SUMMARY

The present invention provides a semiconductor device arrangement and a method of forming a semiconductor device arrangement as described in the accompanying claims.

BRIEF DESCRIPTION OF THE DRAWINGS

A semiconductor device arrangement and a method of forming a semiconductor device arrangement in accordance with the present disclosure will now be described, by way of example only, with reference to the accompanying drawings in which.

DETAILED DESCRIPTION OF THE PREFERRED EMBODIMENTS

In the description that follows and in FIGS. 1-8, certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present disclosure will be described with reference to a semiconductor device arrangement comprising a vertical semiconductor device such as a N-channel vertical MOSFET device. A vertical semiconductor device comprises a source electrode placed over the drain electrode which results in a current flow mainly in a vertical direction when the device is in the on-state. It will be appreciated that the disclosure is not limited to a N-channel vertical device and applies equally to other semiconductor devices, such as P-channel vertical MOSFET devices or insulated gate bipolar transistor (IGBT) devices, or lateral devices or JFETs or similar unipolar devices.

Figure 1:
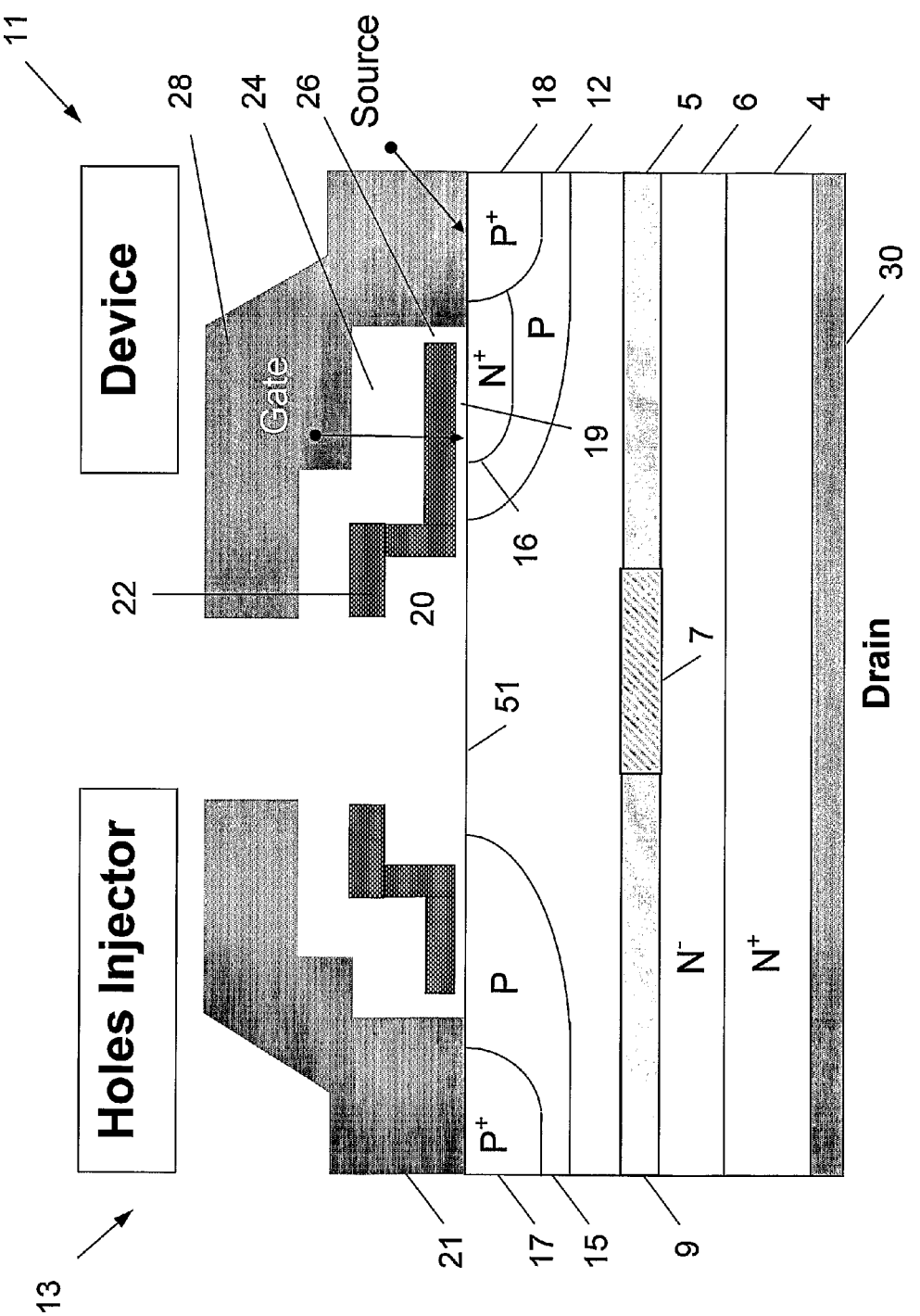
FIG. 1 is a schematic cross-section diagram of a portion of a semiconductor device arrangement in accordance with the disclosure.

Referring now to FIG. 1, a semiconductor device arrangement in accordance with an embodiment of the disclosure comprises a vertical MOSFET device 11 comprising a n-type semiconductor substrate 4 having a first surface and a second surface. A n-type epitaxial layer 6 is formed over the first surface of the semiconductor substrate 4. The doping concentration of the epitaxial layer 6 is less than the doping concentration of the semiconductor substrate 4.

P-type floating regions 5 and 9 are formed in the n-type epitaxial layer 6 having an opening 7 between the floating regions. The p-type floating regions 5 and 9 are buried in the n-type epitaxial layer 6 and are electrically isolated from external source and drain electrodes: in other words, they are not connected to the source or drain regions of the MOSFET device 11 or to other regions at a first surface 51 of the epitaxial layer 6. It will be appreciated that the MOSFET device 11 may include a plurality of p-type floating regions 5 and 9 stacked vertically in the epitaxial layer 6. Openings, like opening 7, are provided between the p-type floating regions to allow for the forward current flow. Alternatively, the MOSFET device 11 may include one floating region.

A p-type body region 12 extends from a first surface 51 of the epitaxial layer 6 through the epitaxial layer 6 typically to a depth of 1.5 microns. A n-type region 16 extends from the first surface 51 of the epitaxial layer 6 into the p-type body region 12. The n-type region 16 is the current electrode region of the semiconductor device. In the embodiment shown in FIG. 1, the n-type region 16 is the source region 16 of the MOSFET device 11 and the semiconductor substrate 4 forms the drain region of the device. An additional p-type region 18 extends into the p-type body region 12 from the first surface 51 of the epitaxial layer 6 and so as to be adjacent the n-type region 16. The doping concentration of the additional p-type region 18 is greater than the doping concentration of the p-type body region 12. P-type region 18 improves contact with the source electrode, reduces the parasitic NPN bipolar action in the body region 12 and avoids punch through between the source region 16 and the n-type epitaxial layer 6.

A field oxide layer 20 extends over the first surface 51 of the epitaxial layer 6 and a gate oxide layer 19 extends over the first surface 51 of the epitaxial layer 6 over body region 12, and a portion of source region 16. Gate oxide layer 19 typically comprises a silicon oxide layer having a thickness of 0.7 microns depending on the operating voltage. An insulated gate region 22 is formed over gate oxide layer 19 and field oxide layer 20 and typically comprises a doped polycrystalline semiconductor material such as polysilicon. A dielectric layer 24 is formed over the insulated gate region 22. The dielectric layer 24 may comprise a silicon oxide or TEOS layer or may comprise several layers, such as oxide/nitride/oxide layers.

A metal or ohmic layer 28 is formed over the dielectric layer 24 and contacts the source region 16 to form the source electrode. A spacer 26 isolates the metal layer 28 from the insulated gate region 22.

A metal or ohmic layer 30 is formed over the second surface of the semiconductor substrate 4 to form the drain electrode.

The semiconductor device arrangement further comprises an injector device 13. The injector device may be a lateral or vertical device such as a diode, an IGBT, a MOSFET device, a bipolar device or similar device. The injector device 13 in accordance with an embodiment comprises a diode device formed by a first p-type region 15 extending from the first surface 51 into the n-type epitaxial layer 6 and a second p-type region 17 extending from the first surface 51 of the n-type epitaxial layer 6 into the first p-type region 15. A metal or conductive or ohmic layer 21 is formed over the first surface of the n-type epitaxial layer 6 in contact with the first 15 and second 17 p-type regions. The doping concentration of the second p-type region 17 is greater than the doping concentration of the first p-type region 15. Having p-type region 17 with a higher doping concentration than p-type region 15 improves the contact with metal layer 21 and increases the number of holes that can be injected by the injector device 13. In an alternative embodiment, the injector device may comprise one p-type injector region formed in the n-type epitaxial layer 6 in contact with the metal layer 21.

The operation of the MOSFET arrangement of FIG. 1 will now be described with reference to FIGS. 2-5 which show the space charge distribution in the MOSFET arrangement of FIG. 1 during different states of its operation. In operation of the MOSFET arrangement of FIG. 1, a channel will be formed connecting the source region 16 through a drift region (voltage sustaining region) formed by the n-type epitaxial layer 6 and the opening 7 in the floating regions 5, 9 to the drain region (substrate 4) allowing a current to flow.

Figure 2:
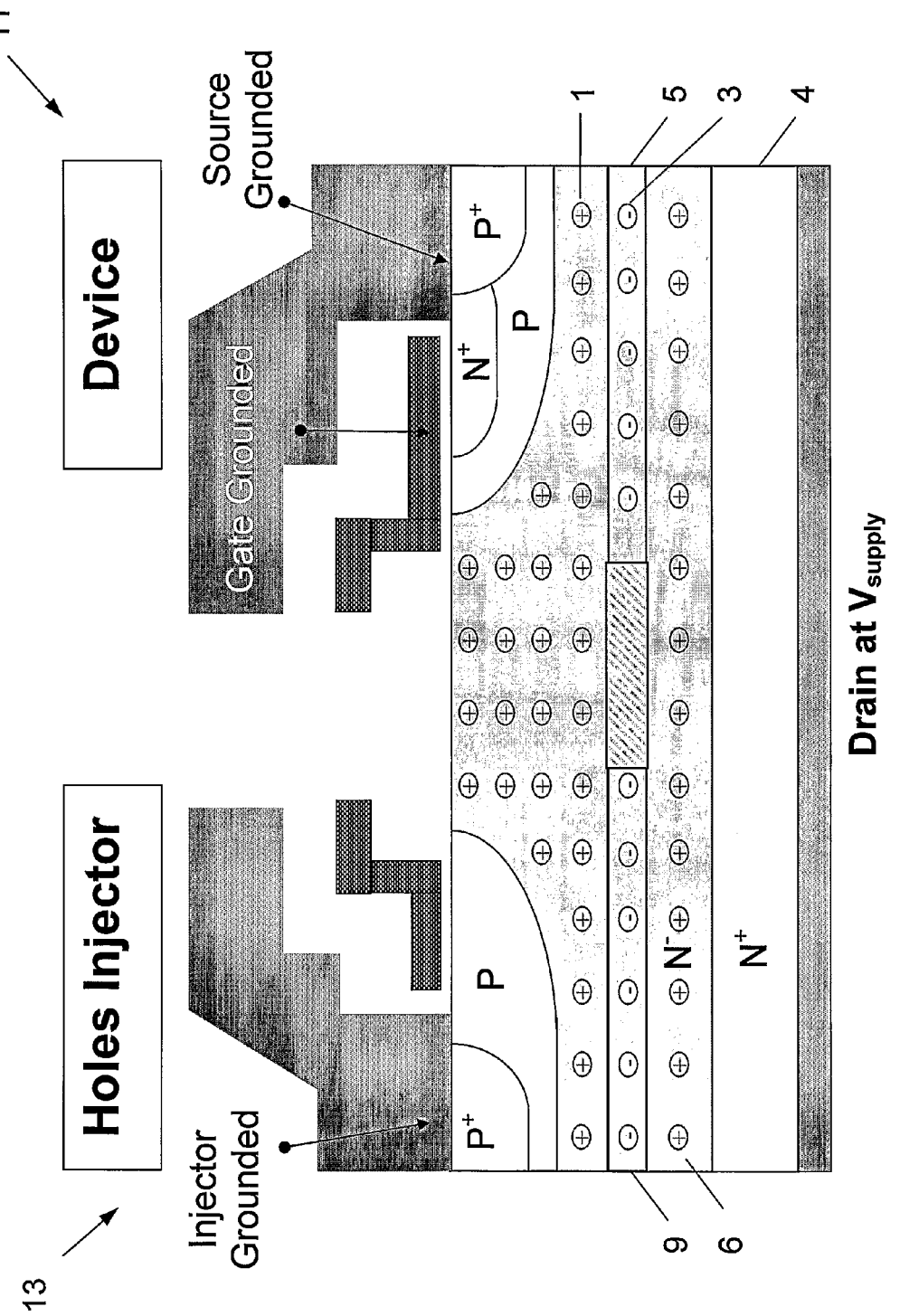
FIGS. 2-5 is a schematic cross-section diagram showing the ionized impurities distribution in the semiconductor device arrangement of FIG. 1 during different states of its operation.

Referring firstly to FIG. 2 which shows the space charge distribution when the MOSFET device 11 is off. In the off-state, the gate and source of the MOSFET device 11 are grounded and the drain is at a voltage of the application supply voltage, Vsupply. Vsupply may be 200 volts, 600 volts or more depending on the application. The injector device 13 is also grounded. Since a positive reverse voltage is applied between the drain and source of the MOSFET device 11, the p charge carriers (i.e. holes) migrate to the source electrode and the n charge carriers (i.e. electrons) migrate to the drain electrode. The effect is that the p-type floating regions 5, 9 and the n-type drift region 6 are fully depleted with all the free charge carriers having been removed. This is illustrated in FIG. 2 by the positive ionized layer 1 in the drift region 6 in which layer atoms have lost their free majority carriers (i.e. electrons) and the negative ionized layer 3 the floating regions 5, 9 in which layer atoms have lost their free majority carriers (i.e. holes).

Figure 3:
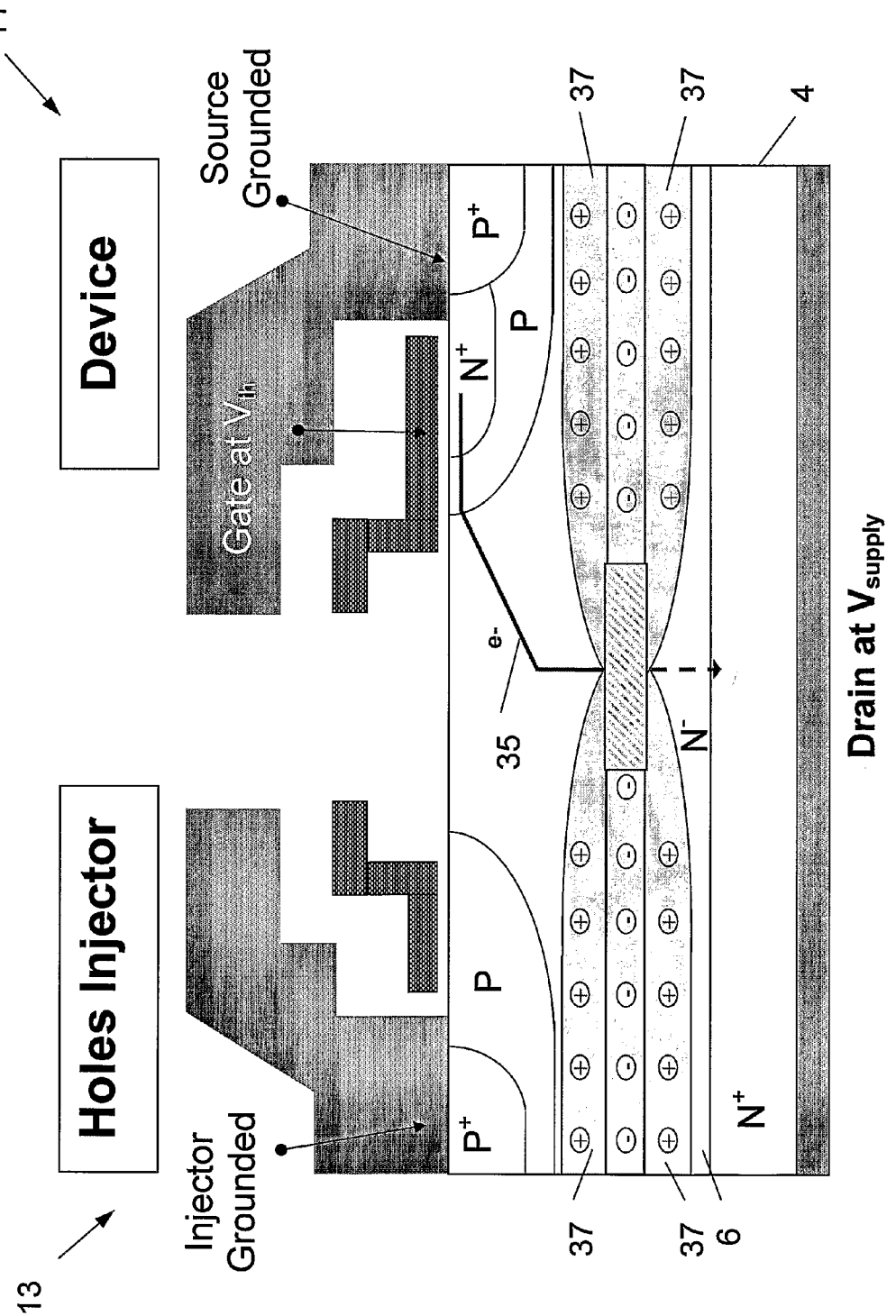

FIG. 3 shows the space charge distribution after the MOSFET device 11 has been turned on by applying a control signal (for example, a threshold voltage signal Vth) to the gate of the MOSFET device 11 when the injector device 13 is not activated. This is equivalent to the known arrangements described above in the introduction. When the device 11 is turned on, the drift region 6 and the buried floating regions 5, 9 do not recover immediately from being fully depleted such that the drift region includes depleted areas 37 around the buried floating regions 5, 9 and the buried floating regions 5, 9 are still depleted. Since the buried floating regions 5, 9 are electrically isolated, it is harder to recover the p majority charge carriers (i.e. holes) in the buried floating regions 5, 9 compared to the n majority charge carriers (i.e. electrons) in the drift region 6. Electrons can be provided from the source region 16 by opening the channel by applying a threshold voltage Vth to the gate of the MOSFET device 11. The depleted areas 37 around the buried floating regions 5, 9 pinches-off the drift region 6. The result is that the on-state resistance Rdson is high and so only a small current indicated by line 35 flows in the channel. By recombination, the holes will eventually be recovered but this will take significant time during which the MOSFET device 11 will be blocked.

Figure 4:
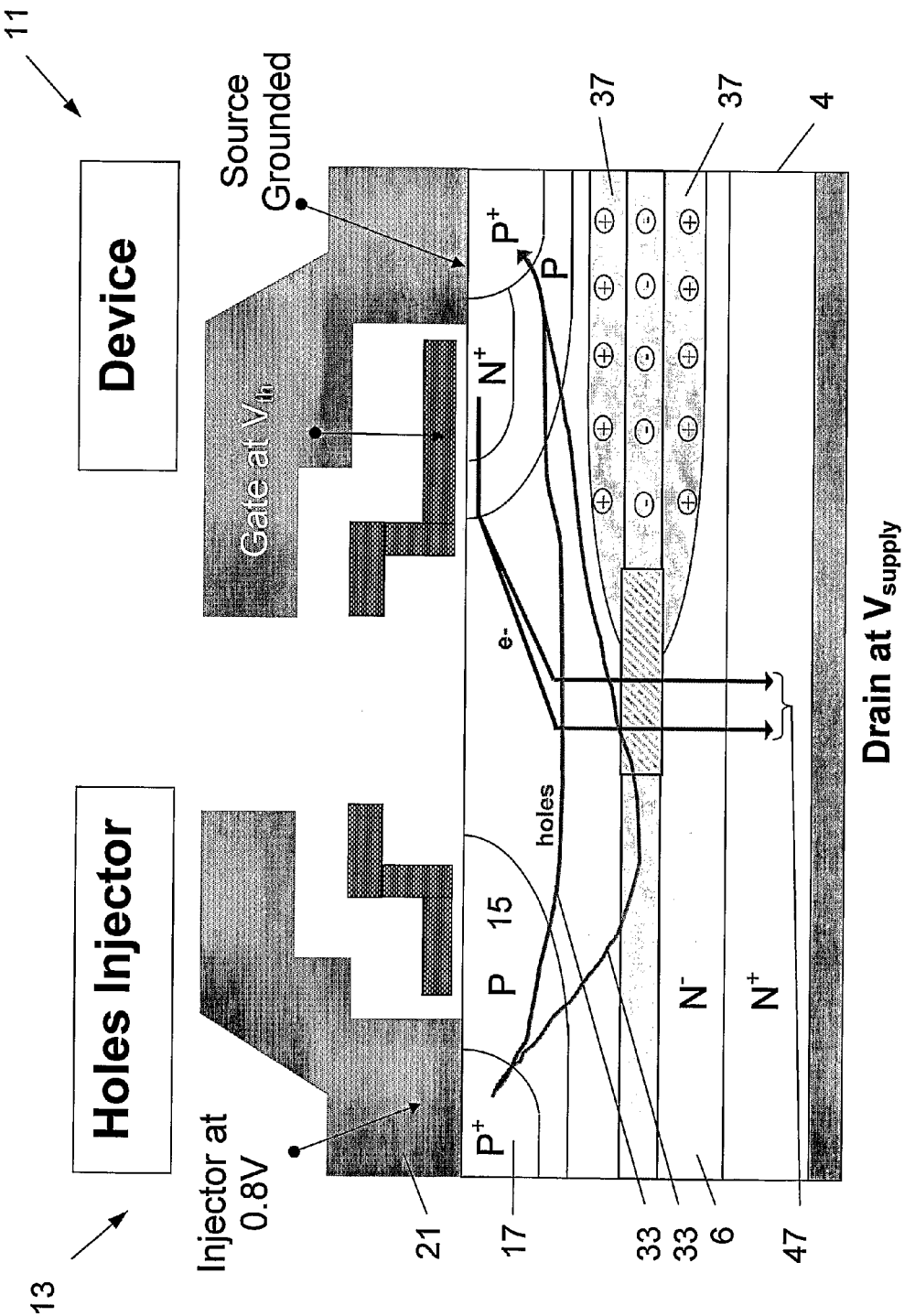
Figure 5:
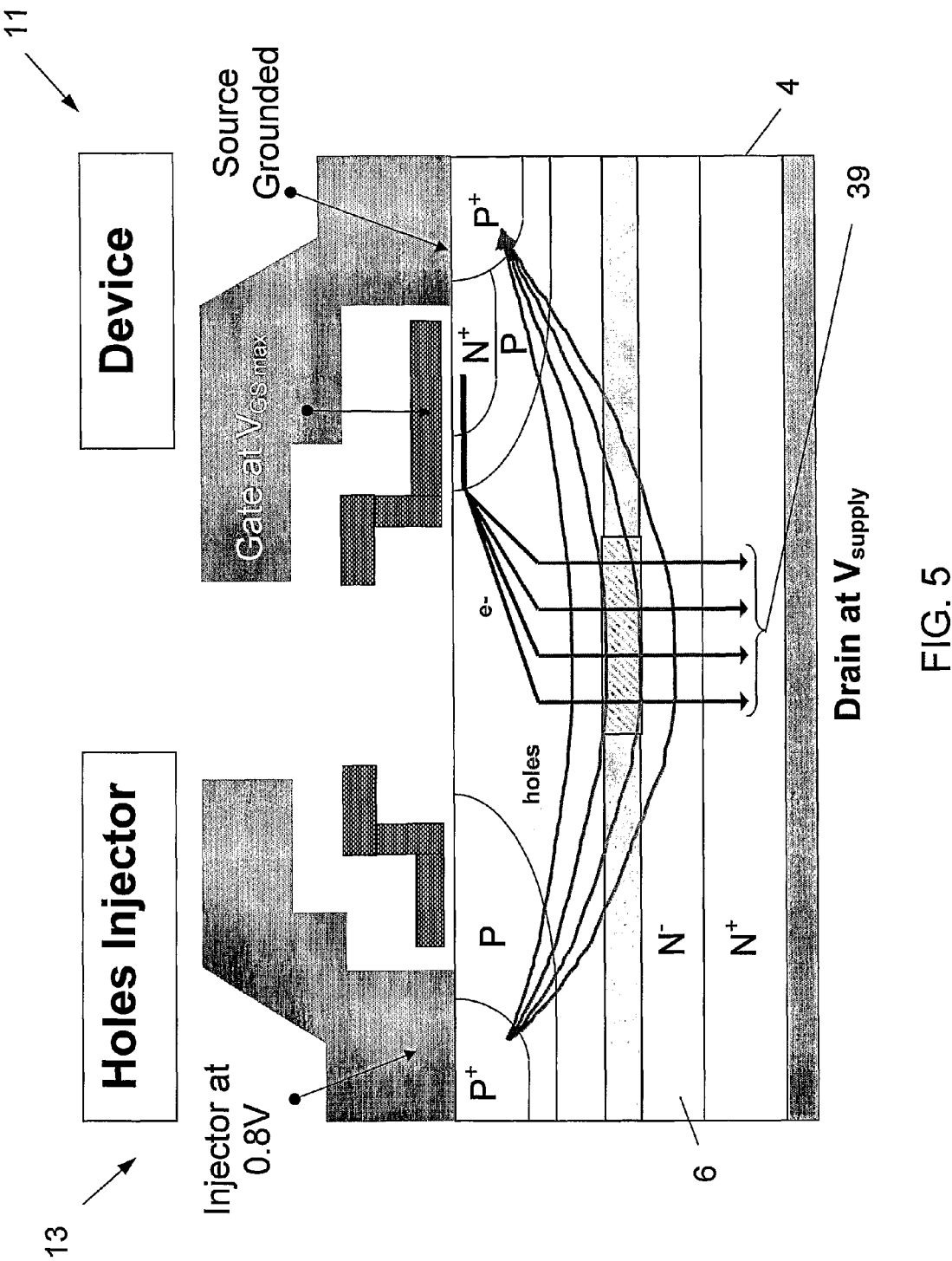

FIG. 4 shows the space charge distribution after the MOSFET device 11 has been turned on by applying a control signal (for example, a threshold voltage signal Vth) to the gate of the MOSFET device and when the injector device 13 is activated by applying an activation signal to the injector device 13.

When the injector device 13 is activated by applying an activation signal, for example, a voltage signal of 0.8V, to the metal layer 21 of the injector device 13, p charge carriers (i.e. holes) are injected into the drift region from the first 15 and second 17 p-type regions. This is due to the injector device 13 providing a PN junction which provides holes and electrons. The injected holes diffuse away (as indicated by lines 33 in FIG. 4) from the first 15 and second 17 regions through the drift region 6 and towards the p-type body region 12 because of the concentration gradient of p charge carriers. As a result, p charge carriers are injected into the drift region 6 and the buried floating regions 5, 9 which recovers the depleted areas: that is, some of the depletion areas 37 in the drift region 6 around the buried floating regions 5, 9 and the depletion areas in part of the buried floating regions 5, 9. As the depletion areas are recovered, the on-state resistance Rdson decreases and the current flowing in the channel increases as can be seen by the two lines 47 in FIG. 4. The MOSFET device 11 is in a semi-blocked on-state.

Over time, the injected p charge carriers migrate through the drift region 6 and the floating regions 5, 9 until no depletion areas remain. In an embodiment, for improved p charge carrier migration, the buried floating regions 5, 9 are connected to provide a single buried floating region to transfer a maximum number of p charge carriers between the regions 5 and 9. Such an arrangement, is described in PCT patent application no. WO 2006/024322. At this point, the MOSFET device 11 is in a full on-state, the on-state resistance Rdson is at a minimum and a maximum current flows as shown by lines 39 in FIG. 5.

Thus, it will be appreciated that as majority charge carriers for the floating regions 5, 9 are provided during the turning on of the MOSFET device 11 by the injector device 13, the floating regions 5, 9 act like a body region connected to the p-type source 18 and body 12 regions which are grounded. For arrangements comprising multiple floating regions 5 (for example, multiple floating regions stacked vertically), the floating regions act together like a single body region. This means that the arrangement in accordance with disclosure does not require additional regions, like the edge termination discussed in the introduction, connected to the floating regions 5, 9 and to the p-type surface regions in order to provide p-type majority charge carriers to recover the depleted areas in the drift region 6 and the floating regions 5, 9.

The response time of the MOSFET device 11 on turn on depends on the time for reducing the on-state resistance Rdson which in turn is determined by the injection of majority charge carriers for the floating regions 5, 9. Since the injector device 13 is controlled by an activation signal, the response time of the MOSFET device can be well controlled according to the activation signal.

In an embodiment, the activation signal is provided to the injector device 13 when the control signal is applied to the gate of the MOSFET device. This ensures that p charge carriers are injected into the drift region 6 when the MOSFET device is turned on which minimises the response time of the MOSFET arrangement. In an alternative embodiment, the activation signal is provided prior to the MOSFET device being turned on: in other words, the injector device 13 injects charge carriers prior to the control signal being applied to the gate of the MOSFET device.

Control circuitry (not shown) is arranged to provide the activation signal, control signal for the gate and the voltage signals for the drain and source electrodes. The control circuitry may be integrated with the MOSFET device 11 and injector device 13 or may be a discrete circuit.

A method of forming a semiconductor device in accordance with an embodiment of the present disclosure will now be described with reference to FIGS. 6-8.

Figure 6:
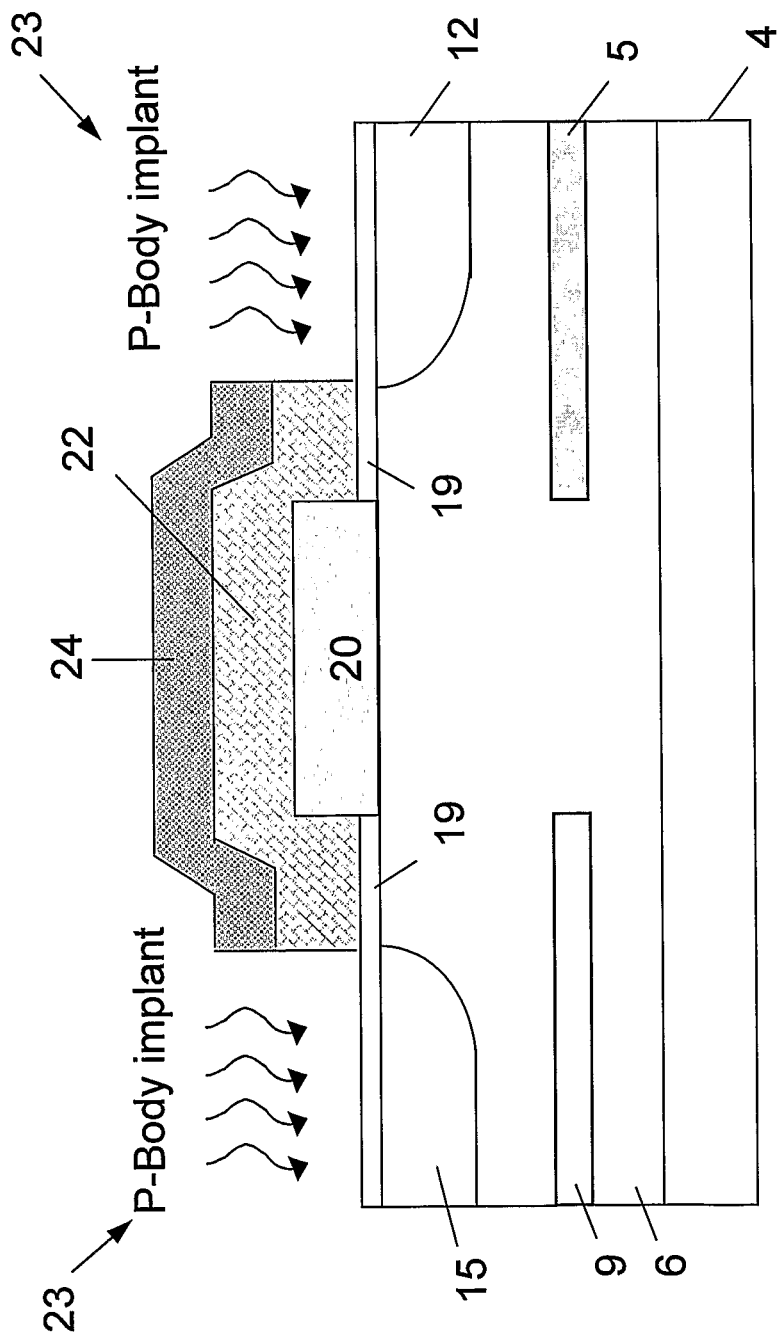
FIGS. 6-8 are schematic cross-section diagrams of the semiconductor device of FIG. 1 during different stages of fabrication.

As shown in FIG. 6, an n-type epitaxial layer 6 is grown on an n-type substrate 4. The doping concentration of the n-type substrate 4 is greater than the doping concentration of epitaxial layer 6. Floating regions 5 and 9 are formed in the epitaxial layer 6. The floating regions may be formed by growing a first part of the epitaxial layer 6 on the substrate 4, providing a layer of p-type material on the first part of the epitaxial layer 6, removing portions of the p-type layer to provide the floating regions 5, 9, and then growing a second part of the epitaxial layer over the floating regions. The first part and second part form the epitaxial layer 6 shown in FIG. 6. In arrangements comprising a plurality of floating regions stacked vertically, the floating regions are formed by alternating between growing part of the epitaxial layer, forming the floating regions from a p-type layer and then growing another part of the epitaxial layer over the formed floating regions.

Since the arrangement in accordance with the disclosure uses buried floating regions, the doping concentration of the epitaxial layer 6 (and hence the drift region) can be greater than in an arrangement without buried floating regions. In an embodiment, due to the user of buried floating regions, the maximum possible electric field is divided by 2 which allows the doping concentration of the epitaxial layer 6 (or drift region 6) to be multiplied by a factor 1.5 to 2 compared to a device without buried floating regions. As discussed above, this reduces the on-state resistance Rdson of such an arrangement.

A dielectric layer 20, such as a silicon oxide layer, is then formed over the device. A first opening (not shown) is made through the dielectric layer 20 (the field oxide layer 20) by way of patterning and etching and a dielectric layer 19, the gate oxide layer 19, is grown on the epitaxial layer 6 in the first opening (not shown). A polysilicon layer 22, or other type of conductive layer, is then formed over the gate oxide layer 19 and the field oxide layer 20, for example, by deposition. A dielectric layer 24 is then deposited over the polysilicon layer 22. The dielectric layer 24 may comprise a silicon oxide or TEOS layer or may comprise several layers, such as oxide/nitride/oxide layers.

The dielectric layer 24 and the polysilicon layer 22 are then etched to provide a body openings 23 through which the body region 12 and first p-type region 15 may be formed in the epitaxial layer 6. The etched polysilicon layer 22 forms the insulated gate region 22 of the MOSFET device.

The p-type body region 12 and first p-type region 15 is then formed by implantation or diffusion of a p-type material, such as boron (B11+), in the epitaxial layer 6 through the body openings 23. Preferably, a doping dose in the range of 5e13 cm$^{-2}$ is used. The wafer is then subjected to a high temperature, for example around 1080° C., to drive the p-type body region and first p-type region 15 into the epitaxial layer 6 as shown in FIG. 6.

Figure 7:
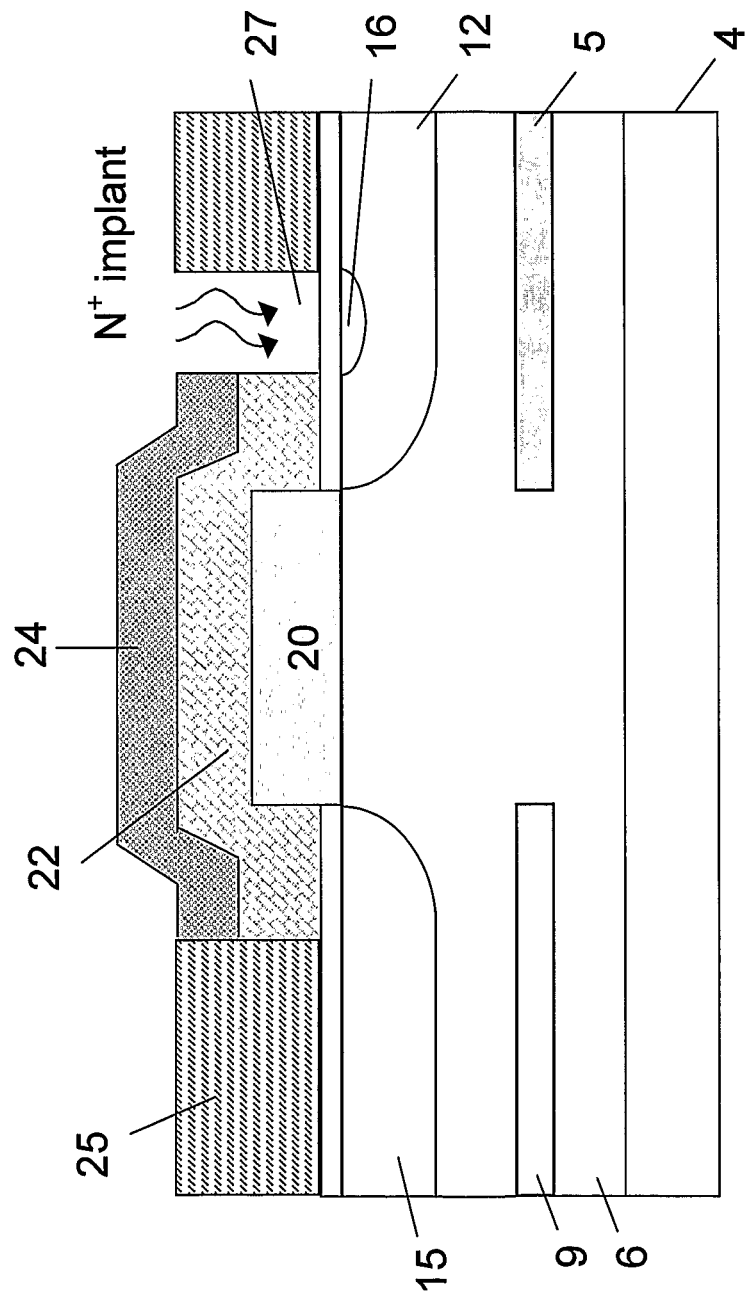

A mask 25 is formed over a portion of the dielectric layer 19 to mask off the body openings 23 and leave an opening 27 as shown in FIG. 7. The source region 16 is then formed by implantation of a n-type material, such as arsenic or phosphorus, into the epitaxial layer 6. Since the source region 16 is implanted through the opening 27 which is defined by the mask 25 and the insulated gate region 22, the source region 16, and the body region 12 are self-aligned.

Figure 8:
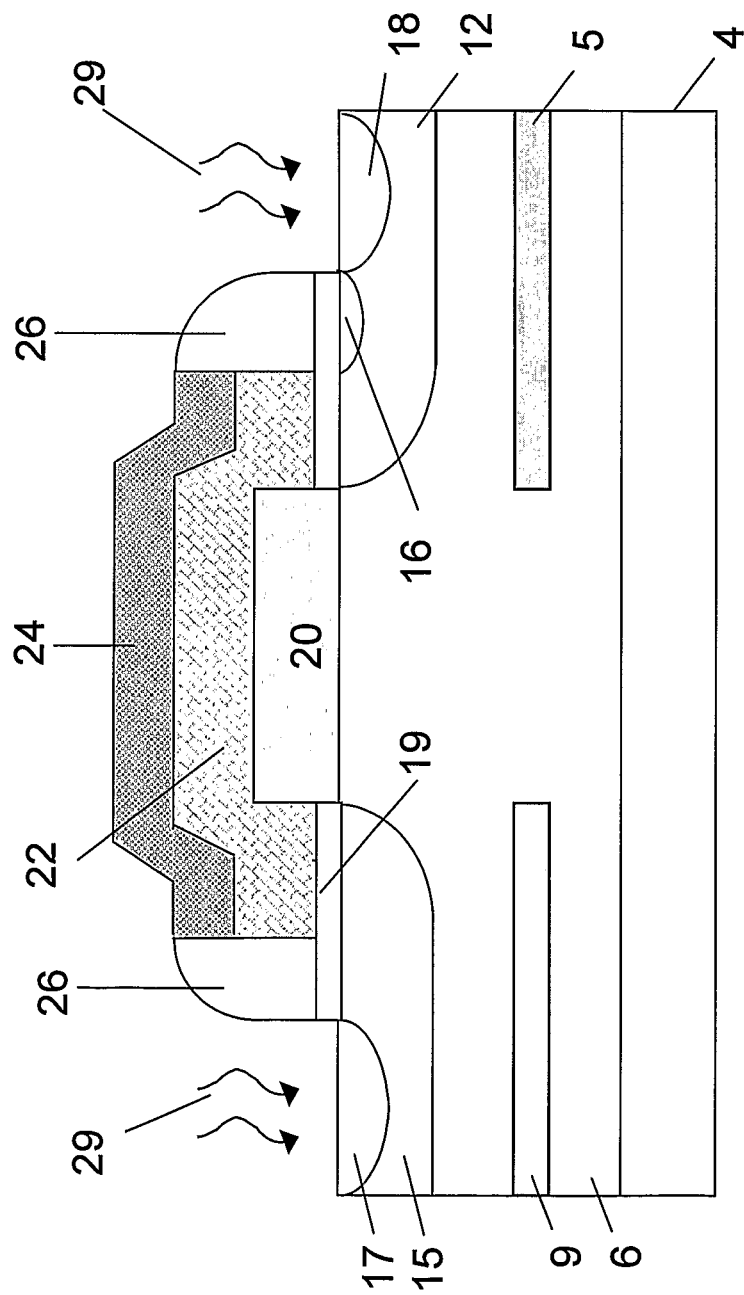

Referring now to FIG. 8, a dielectric layer (not shown), such as a TEOS layer, is formed over the dielectric layer 24 and the gate oxide layer 19. This dielectric layer (not shown) and the gate oxide layer 19 are then etched to provide a spacer 26 and openings 29, through which p-type material is implanted to form the additional p-type region 18 and the second p-type region 17. Preferably, the implant step comprises implanting a p-type material, such as born (B11+), having a doping dose of about 5e15 cm$^{-2}$.

The partly processed semiconductor device is then subjected to a low thermal operation and short drive so as to drive the source region 16, body region 12, first p-type region 15, second p-type region 17 and additional p-type region 18 into the epitaxial layer 6. For example, the semiconductor device is annealed up to a temperature of 900-950° C. for 30 minutes. Other process steps then take place including metallization wherein a metal layer 28 is formed on the dielectric layer 24 in contact with the source region 16 so as to provide the source electrode, metal layer 21 is formed in contact with the first 15 and second 17 p-type regions so as to provide an electrode to the injector device 13 and a metal layer 30 is formed on the second surface of the substrate 4 so as to provide the drain electrode, as shown in FIG. 1. The spacer 26 isolates the metal layer 28 from the insulated gate region 22.

It will be appreciated that for the embodiments described above since the first 15 and second 17 p-type regions of the injector device can be formed when the p-type regions of the MOSFET device 11 are formed, the injector device 13 does not require any additional masks and so there is no significant increase in manufacturing costs.

It will be appreciated that a MOSFET device typically comprises a plurality of transistor base cells having different shapes, such as hexagonal cells, fingers, strips or waves. FIGS. 1-5 show a simplified cross-sectional view of only a portion of a base cell having an injector device for simplicity. The MOSFET device arrangement in accordance with the disclosure may comprise an injector device formed within each transistor base cell or alternatively, may comprise one or more injector device(s) for the plurality of transistor base cells.

In summary, the present invention provides an improved semiconductor device that has a low Rdson with improved device performance while not increasing the manufacturing cost.

The invention claimed is:

1. A semiconductor device arrangement comprising:
a semiconductor device comprising:
a semiconductor substrate of a first conductivity type forming a second current electrode region, the substrate having a first surface and a second surface;
a semiconductor layer formed over the first surface of the semiconductor substrate;
a first current electrode region of the first conductivity type formed in the semiconductor layer,
a drift region of the first conductivity type between the first and the second current electrode regions,
at least one floating region of a second conductivity type formed in the drift region; and
an injector device comprising an injector region of the second conductivity type formed in the semiconductor layer, the injector device for injecting charge carriers of the second conductivity type into the drift region and the at least one floating region in response to being activated by application of an activation signal.

2. A semiconductor device arrangement of claim 1, wherein the at least one floating region is electrically isolated from the first and second current electrode regions.

3. A semiconductor device arrangement of claim 2, wherein the semiconductor device further comprises a semiconductor substrate forming the second current electrode region, the semiconductor layer being formed over the semiconductor substrate, and wherein the first current electrode region is formed in the semiconductor layer extending from a first surface of the semiconductor layer, and the injector device comprises an injector region of the second conductivity type formed in the semiconductor layer extending from the first surface and the drift region is formed in the semiconductor layer.

4. A semiconductor device arrangement of claim 1, wherein the semiconductor device is one of a unipolar device, a vertical semiconductor device, a MOSFET device and an IGBT device.

5. A semiconductor device arrangement of claim 1, wherein the semiconductor device further comprises a semiconductor substrate forming the second current electrode region, the semiconductor layer being formed over the semiconductor substrate, and wherein the first current electrode region is formed in the semiconductor layer extending from a first surface of the semiconductor layer, and the injector device comprises an injector region of the second conductivity type formed in the semiconductor layer extending from the first surface and the drift region is formed in the semiconductor layer.

6. A semiconductor device arrangement of claim 1, wherein the injector device further comprises a contact electrode coupled to the injector region for receiving the activation signal.

7. A semiconductor device arrangement of claim 6, wherein the semiconductor device comprises a plurality of base cells, each base cell comprising first and second current electrode regions, a drift region and at least one floating region and wherein the semiconductor device arrangement comprises one or more injector devices for the plurality of base cells.

8. A semiconductor device arrangement of claim 1, further comprising a control electrode for controlling a flow of current through a channel between the first current electrode region and the second current electrode region.

9. A semiconductor device arrangement of claim 8, further comprising control circuitry for providing a control signal to the control electrode to turn the semiconductor device on and for providing the activation signal to the injector device in dependence on the provision of the control signal.

10. A semiconductor device arrangement of claim 9, wherein the control circuitry is arranged to provide the activation signal to the injector device before providing the control signal to the control electrode.

11. A semiconductor device arrangement of claim 1, wherein the semiconductor device comprises a plurality of base cells, each base cell comprising first and second current electrode regions, a drift region and at least one floating region and wherein the semiconductor device arrangement comprises one or more injector devices for the plurality of base cells.

12. The semiconductor device of claim 1, wherein the drift region and the at least one floating region are arranged such that the at least one floating region and the drift region are depleted when the semiconductor device is off.

13. A method of forming a semiconductor device arrangement comprising a semiconductor device, the method comprising the steps of:
    providing a semiconductor substrate of a first conductivity type;
    providing a semiconductor layer of the first conductivity type over the semiconductor substrate;
    forming in said semiconductor layer a drift region of the first conductivity type;
    forming a first current electrode region of the first conductivity type in the semiconductor layer, extending from a first surface of the semiconductor layer, the semiconductor substrate forming a second current electrode region of the semiconductor device;
    forming at least one floating region of a second conductivity type in the drift region; and
    forming an injector device in the semiconductor layer, the injector device comprising an injector region of the second conductivity type formed in the semiconductor layer extending from the first surface, the injector device being arranged to inject charge carriers of the second conductivity type into the semiconductor layer and the at least one floating region in response to being activated by an activation signal.

14. A method of claim 13, wherein the at least one floating region is electrically isolated from the first and second current electrode regions.

15. A method of claim 14, further comprising:
    forming a control electrode for controlling a flow of current through a channel between the first current electrode region and the second current electrode region; and
    providing control circuitry for providing a control signal to the control electrode to turn the semiconductor device on and for providing the activation signal to the injector device in dependence on the provision of the control signal.

16. A method of claim 13, wherein the semiconductor device is one of a unipolar device, a vertical semiconductor device, a MOSFET device and an IGBT device.

17. A method of claim 13, further comprising forming a contact electrode coupled to the injector region for receiving the activation signal.

18. A method of claim 13, further comprising:
    forming a control electrode for controlling a flow of current through a channel between the first current electrode region and the second current electrode region; and
    providing control circuitry for providing a control signal to the control electrode to turn the semiconductor device on and for providing the activation signal to the injector device in dependence on the provision of the control signal.

19. A method of claim 13, comprising forming a semiconductor device comprising a plurality of base cells, each base cell comprising the first and second current electrode regions, a drift region and at least one floating region, and forming one or more injector devices in the semiconductor layer for the plurality of base cells.

20. The method of claim 13, wherein the forming the at least one floating region of the second conductivity type in the drift region comprises:
    forming the at least one floating region of the second conductivity type in the drift region, such that the at least one floating region and the drift region are depleted when the semiconductor device is off.

* * * * *